(12) United States Patent
Shu

(10) Patent No.: US 7,408,779 B1
(45) Date of Patent: Aug. 5, 2008

(54) HEAT-DISSIPATING ELEMENT WITH CONNECTING STRUCTURES

(76) Inventor: Cheng-Kun Shu, 7F., No. 27, Lane 61, Sec. 1, Guangfu Rd., Sanchong City, Taipei County 24158 (TW)

( * ) Notice: Subject to any disclaimer, the term of this patent is extended or adjusted under 35 U.S.C. 154(b) by 0 days.

(21) Appl. No.: 11/845,074

(22) Filed: Aug. 26, 2007

(51) Int. Cl.
*H05K 7/14* (2006.01)
*H05K 7/20* (2006.01)

(52) U.S. Cl. .................. 361/707; 361/709; 361/710; 361/711; 361/715; 361/716

(58) Field of Classification Search ............... 361/707, 361/709, 710, 711, 715, 716
See application file for complete search history.

*Primary Examiner*—Evan Pert
(74) *Attorney, Agent, or Firm*—Banger Shia

(57) ABSTRACT

A heat-dissipating element with connecting structures comprises at least two opposite stop edges. Each stop edge is formed with at least one connecting structure, and each connecting structure includes a first connecting portion which has a fastener and a fastening hole and a second connecting portion which has a positioning concave portion and a positioning protrusion. The heat-dissipating elements are assuredly assembled with each other through the engagement and fastening connection of the first connecting portion and the second connecting portion.

3 Claims, 6 Drawing Sheets

HEAT-DISSIPATING ELEMENT WITH CONNECTING STRUCTURES

BACKGROUND OF THE INVENTION

1. Field of the Invention

The present invention relates to a heat-dissipating element structure, and more particularly to a heat-dissipating element with connecting structures.

2. Description of the Prior Art

Recently, with the rapid development of the computer, the products are required to be thinner and thinner and the electronic elements are required to be tinier and tinier. While the electronic products pursue the abovementioned objectives, the heat dissipation becomes one of the most important problems that affect the operation of the electronic products. Hence, for various electronic products, various heat-dissipating elements have been developed on the market. For example, a conventional heat-dissipating element 10 (please refer to FIG. 1) is formed with two Y-shaped connecting structures 11 at opposite sides thereof. The connecting structure 11 includes an extending segment 12 and an engaging segment 13 connected with the extending segment 12. The engaging segment 13 of the connecting structure 11 of one heat-dissipating element 10 is flexibly bended to engage with the other heat-dissipating element 10. Based on further analysis of the above-mentioned conventional structure, it still has the following disadvantages:

1. After the engaging operation, the engaging segment 12 is easy to deform again due to the external force, so it is unable to assuredly position the heat-dissipating element 10, thus causing the easy disengagement of the heat-dissipating element 10 and low efficiency of heat dissipation.

2. Under the incertitude engagement, if the heat-dissipating elements 10 are disposed in the space full of electric circuits, it is likely to cause the short circuit by mis-touching the electric circuits, thus damaging the electric circuits.

The present invention has arisen to mitigate and/or obviate the afore-described disadvantages.

SUMMARY OF THE INVENTION

The primary objective of the present invention is to provide a heat-dissipating element with connecting structures which can be assuredly assembled to other heat-dissipating elements through the connecting structures.

In order to achieve the abovementioned objective, the heat-dissipating element of the present invention is formed with at least two connecting structures at opposite sides thereof. Each connecting structure includes a first connecting portion which has a fastener and a fastening hole and a second connecting portion which has a positioning concave portion and a positioning protrusion. The first connecting portion and the second connecting portion are connected with the stop edge respectively. Thereby, the heat-dissipating elements can be assuredly assembled with each other through the engagement and fastening connection of the first connecting portion and the second connecting portion, thus achieving the following advantages:

1. The heat-dissipating elements are assuredly assembled with each other to avoid the disengagement and ensure the efficiency of heat dissipation;

2. Under the assured engagement, it is unnecessary to worry about that the heat-dissipating elements will fall off accidentally touching the electric circuit to cause short circuit, thus extending the service life.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
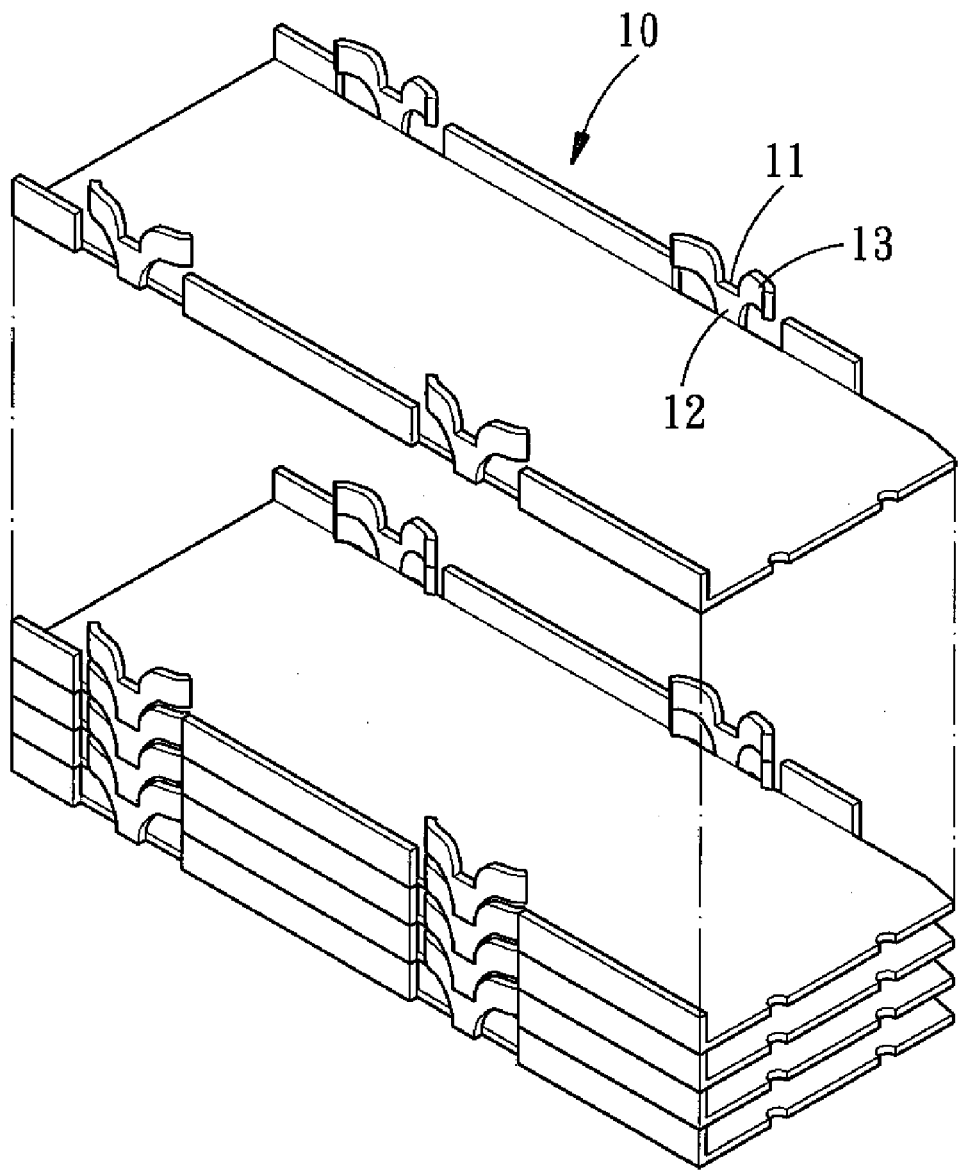
FIG. 1 is a perspective view of a conventional heat-dissipating element.
Figure 2:
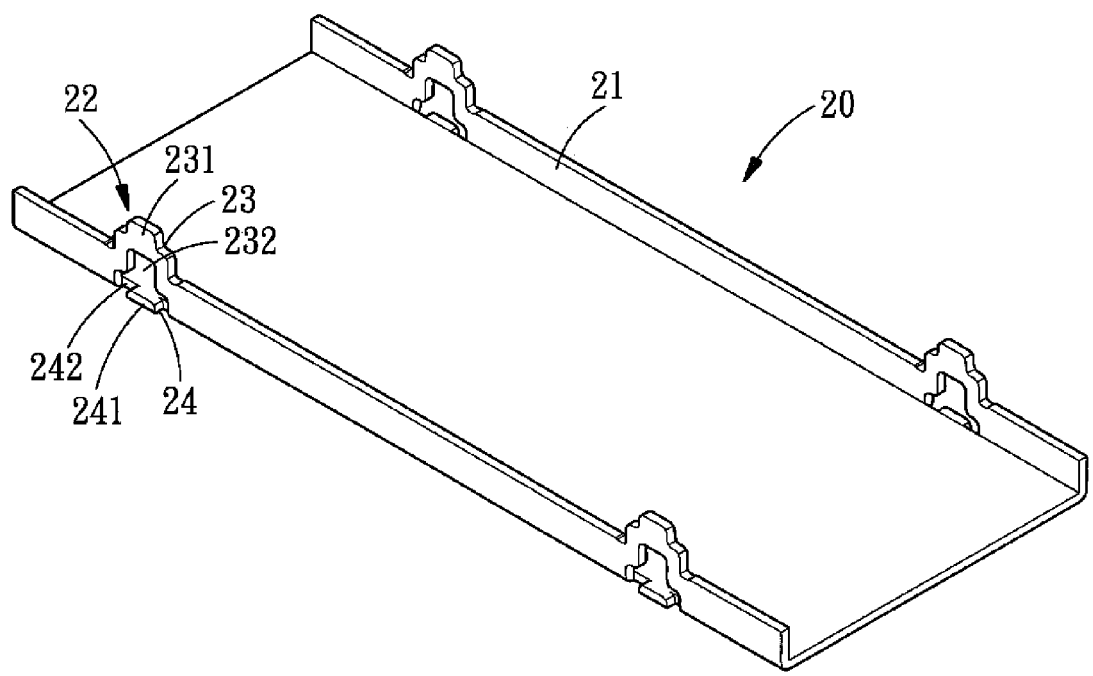
FIG. 2 is a perspective view of a heat-dissipating element with connecting structures in accordance with the present invention.
Figure 3:
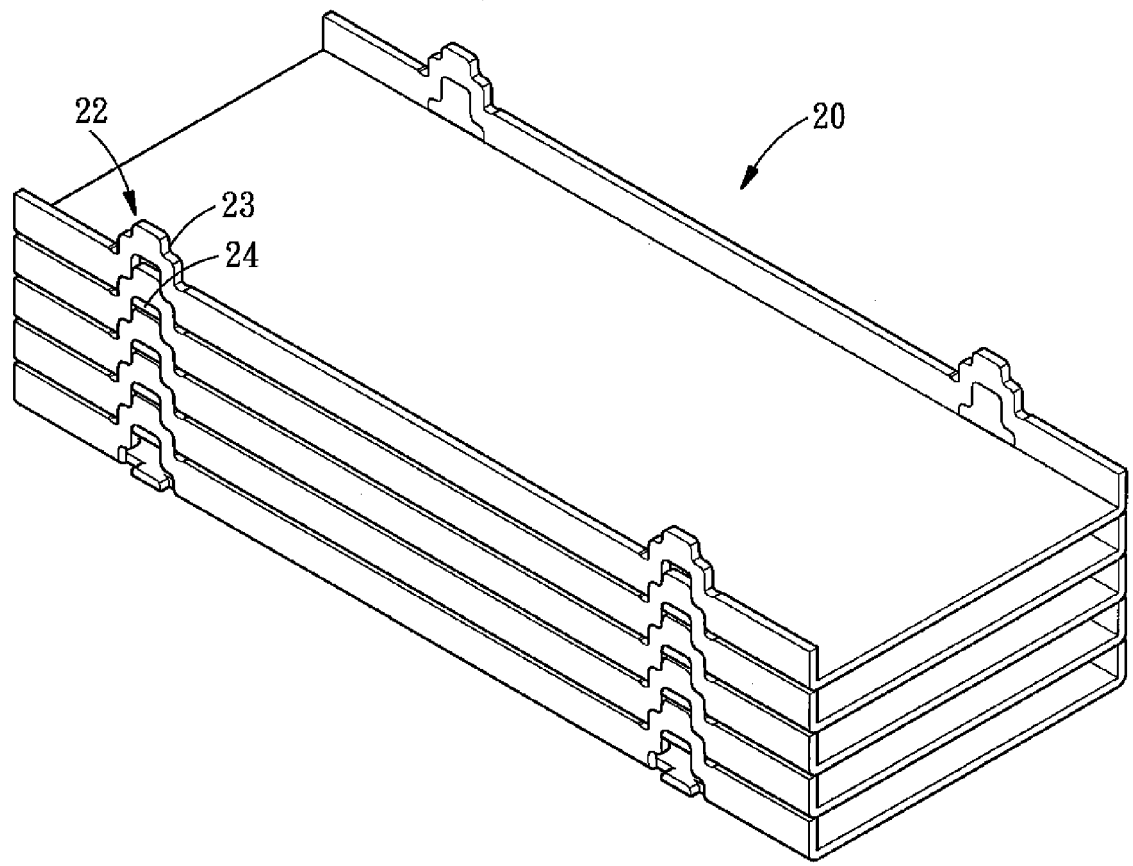
FIG. 3 is an assembly view of the heat-dissipating element with connecting structures in accordance with the present invention.
Figure 4:
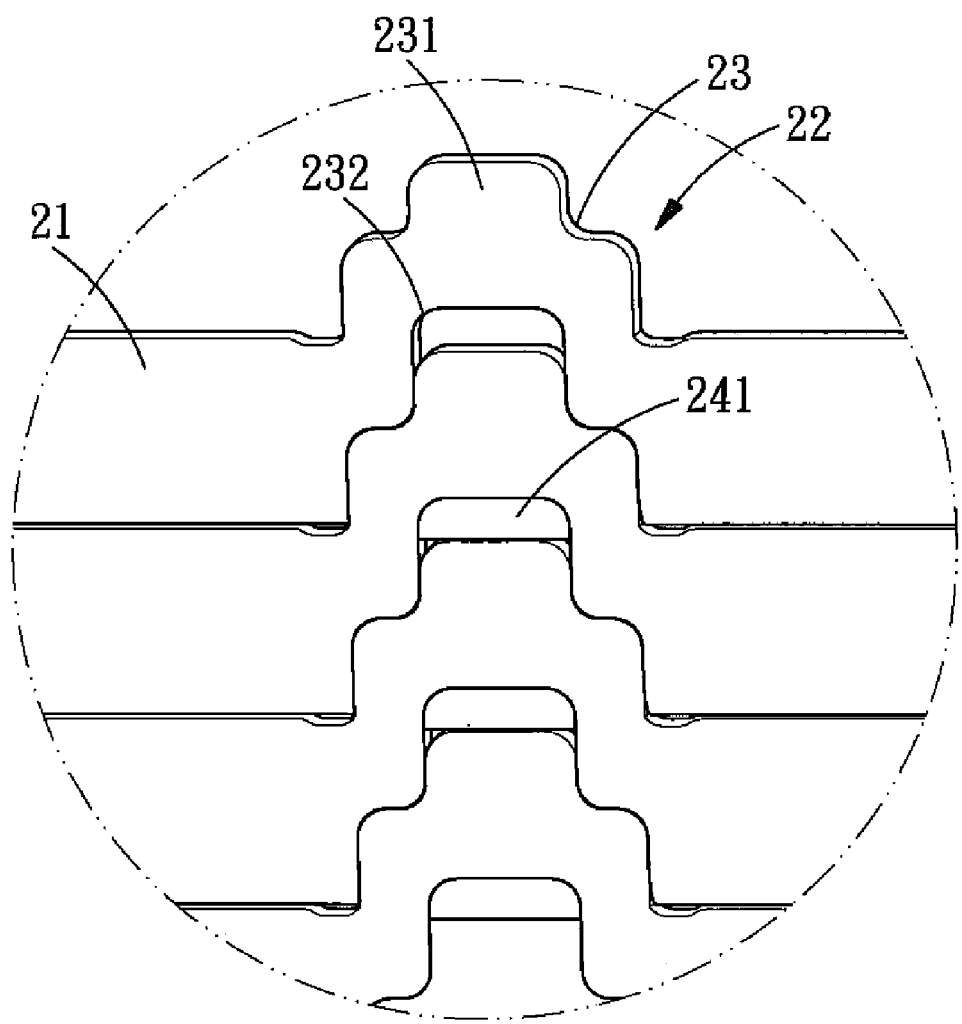
FIG. 4 is a partial view of the heat-dissipating element with connecting structures in accordance with the present invention.

Referring to FIGS. 2-4, a heat-dissipating element 20, with connecting structures in accordance with a preferred embodiment of the present invention is a rectangular chip element made of flexible metal material and comprises two vertical stop edges 21 located at two opposite sides thereof. On each stop edge 21 is formed at least one connecting structure 22. In this embodiment, each stop edge 21 is formed with two spaced connecting structures 22 located correspondingly to each other.

The connecting structure 22 is a square-shaped structure and includes a first connecting portion 23 and a second connecting portion 24 that are integrally connected with the stop edge 21. The first connecting portion 23 and the second connecting portion 24 are spaced to define a clearance. The second connecting portion 24 is located under the first connecting portion 23.

The first connecting portion 23 is disposed with a fastener 231 having a fastening hole 232. The fastener 231 is extended higher than the stop edge 21, and both ends of the fastener 231 are connected with the stop edge 21.

The second connecting portion 24 is formed with a positioning protrusion 241 and two positioning concave portions 242 that are located correspondingly to the fastener 231 and the fastening hole 232 of the first connecting portion 23. The positioning concave portions 242 are formed at both sides of the positioning protrusion 241 and connected with the stop edge 21, respectively.

The aforementioned is the summary of the positional and structural relationship of the respective components of the preferred embodiment in accordance with the present invention.

Figure 5:
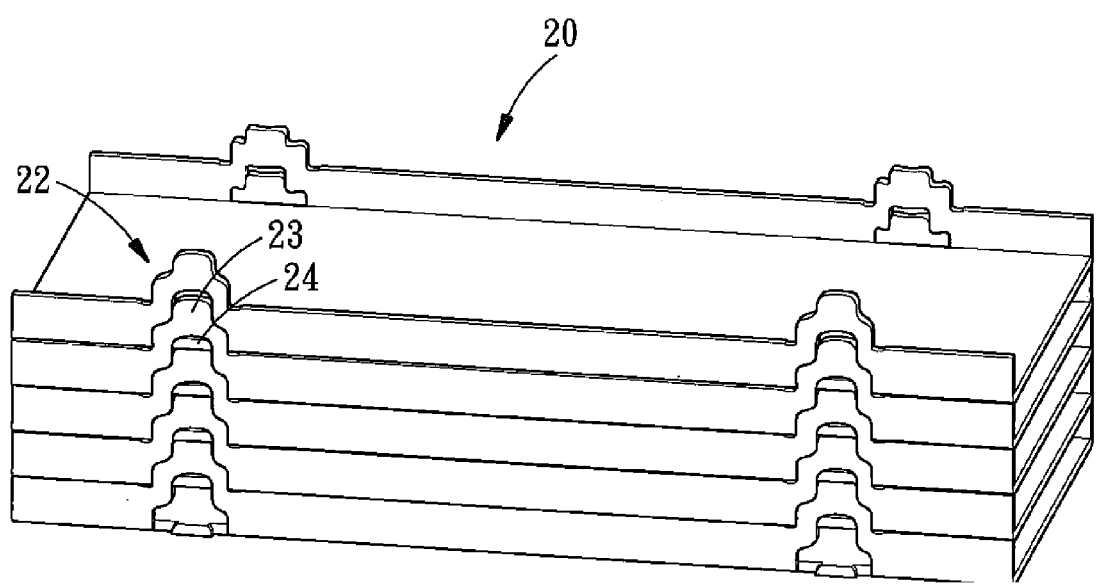
FIG. 5 is a perspective view of showing the deformation of the connecting structures in accordance with the present invention.
Figure 6:
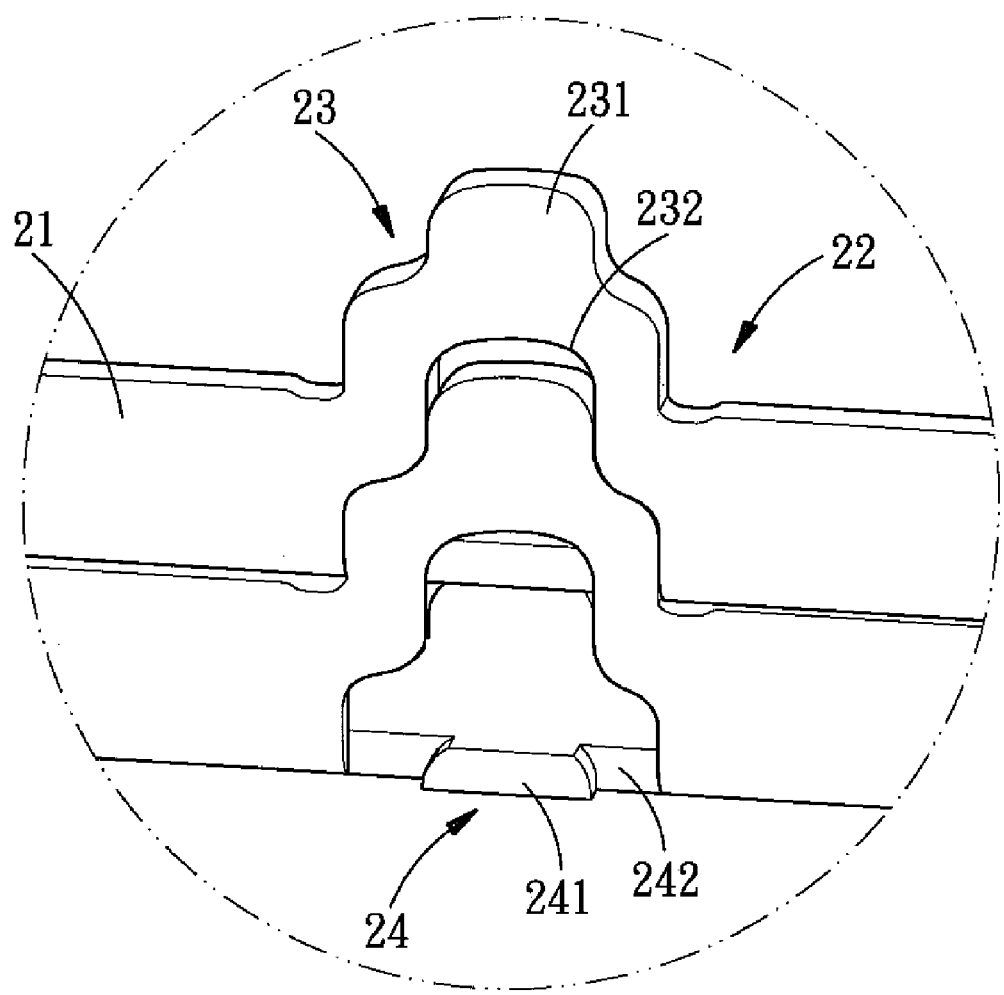
FIG. 6 is a partial view of showing the deformation of the connecting structures in accordance with the present invention.

For a better understanding of the present invention, its operation and function, reference should be made to FIGS. 3-6:

When in use, the heat-dissipating elements 20 (please refer to FIGS. 3-4) are piled one upon the other. The stop edge 21 of one heat-dissipating element 20 is positioned against the other heat-dissipating element 20. Afterwards, the first connecting portion 23 of the connecting structure 22 of one heat-dissipating element 20 is positioned to the second connecting portion 24 of the connecting structure 22 of the other heat-dissipating element 20, so that the positioning protrusion 241 of the second connecting portion 24 is engaged into the fastening hole 232 of the first connecting portion 23, and the fastener 231 of the first connecting portion 23 is fastened in the positioning concave portion 242 of the second connecting portion 24. And finally, applying a force to the first connecting portion 23 makes the fastener 23 deform (as shown in FIGS. 5-6) to assuredly assemble the two heat-dissipating elements 20 together through the first connecting portion 23 and the second connecting portion 24 of the connecting structure 22. Thus, the present invention has the following advantages:

1. The heat-dissipating elements 20 are assuredly assembled with each other through the engagement and fastening connection of the first connecting portion 23 and the second connecting portion 24, thus avoiding the disengagement and ensuring the efficiency of heat dissipation;

2. Under the assured engagement of the heat-dissipating elements 20 with one another, even if they are disposed in the space full of electric circuits, it is unnecessary to worry about that the heat-dissipating element 20 will fall off to accidentally touch the electric circuit to cause short circuit, thus not only guaranteeing safe use but also extending the service life.

To summarize, the heat-dissipating element with connecting structures in accordance with the present invention comprises at least two opposite stop edges. Each stop edge is formed with at least one connecting structure, and each connecting structure includes a first connecting portion which has a fastener and a fastening hole and a second connecting portion which has a positioning concave portion and a positioning protrusion. The heat-dissipating elements are assuredly assembled with each other through the engagement and fastening connection of the first connecting portion and the second connecting portion.

While we have shown and described various embodiments in accordance with the present invention, it is clear to those skilled in the art that further embodiments may be made without departing from the scope of the present invention.

What is claimed is:

1. A heat-dissipating element with connecting structures comprising: two stop edges at two opposite sides thereof, each stop edge being integrally formed with at least one connecting structure; wherein:

the connecting structure includes a first connecting portion and a second connecting portion, that are spaced to define a clearance between the heat-dissipating element and another heat-dissipating element, the first connecting portion is adjacently disposed with a fastening hole and a fastener, and the second connecting portion is adjacently disposed with a positioning protrusion and a positioning concave portion, that are located correspondingly to the fastener and the fastening hole of the first connecting portion, a shape of the positioning protrusion of the second connecting portion of one heat-dissipating element corresponds to a shape of the fastening hole of the first connecting portion of the other heat-dissipating element, and the positioning protrusion of the second connecting portion of one heat-dissipating element is engaged in the fastening hole of the first connecting portion of the other heat-dissipating element, a shape of the positioning concave portion of the second connecting portion of one heat-dissipating element corresponds to a shape of the fastener of the first connecting portion of the other heat-dissipating element, and the fastener of the first connecting portion of one heat-dissipating portion is fastened in the positioning concave portion of the second connecting portion of the other heat-dissipating portion.

2. The heat-dissipating element with connecting structures as claimed in claim 1, wherein the second connecting portion is located under the first connecting portion.

3. The heat-dissipating element with connecting structures as claimed in claim 1, wherein the connecting structures are each a square-shaped structure.

* * * * *